United States Patent

[11] 3,615,938

[72] Inventor Joseph C. Tsai
Laurel, Md.
[21] Appl. No. 794,550
[22] Filed Jan. 28, 1969
[23] Division of Ser. No. 553,222,
May 26, 1971
[45] Patented Oct. 26, 1971
[73] Assignee Westinghouse Electric Corporation
Pittsburgh, Pa.

[54] METHOD FOR DIFFUSION OF ACCEPTOR IMPURITIES INTO SEMICONDUCTORS
1 Claim, 8 Drawing Figs.

[52] U.S. Cl. .......... 148/187, 29/571, 317/235 A, 317/235 B, 317/235 C
[51] Int. Cl. .......... H01l 7/44
[50] Field of Search .......... 148/187; 29/571; 317/235 (21), 235 (21.1), 235 (21.3)

[56] References Cited

UNITED STATES PATENTS

| | | | |
|---|---|---|---|
| 3,432,920 | 3/1969 | Rosenzweig | 148/187 |
| 3,440,503 | 4/1969 | Gallagher et al. | 317/235 |
| 3,484,309 | 2/1969 | Gilbert | 148/187 |
| 3,490,964 | 1/1970 | Wheeler | 148/187 |

*Primary Examiner*—L. Dewayne Rutledge
*Assistant Examiner*—R. A. Lester
*Attorneys*—F. Shapoe, C. L. Menzemer and Gordon H. Telfer

ABSTRACT: A diffusion process for acceptor impurities is provided wherein, after deposition of the impurity on the semiconductor surface, the surface is covered by a deposited insulating layer to avoid out diffusion during the heating to drive in the deposited impurity.

METHOD FOR DIFFUSION OF ACCEPTOR IMPURITIES INTO SEMICONDUCTORS

CROSS-REFERENCE TO RELATED APPLICATION

This application is a division of application, Ser. No. 553,222, filed May 26, 1966.

BACKGROUND OF THE INVENTION

1. Field of the Invention

This application is directed to semiconductor structures having diffused PN-junctions and to methods of making such structures. More particularly, the application describes a process for the controlled diffusion of acceptor impurities, for example boron, into semiconductors, for example silicon, and structures made possible thereby including structures having junctions at different depths.

2. Description of the Prior Art

Boron is the most commonly used acceptor impurity for diffusion into silicon. Typically, where boron is used as the impurity for the base region of an NPN-transistor, a thin layer of boron (or a material containing boron, such as boron trioxide, a doped pyrolytic oxide) is first deposited at a temperature in the range of about 700° C.–960' C. and then diffused to the desired depth and resistivity at a higher temperature without the presence of a boron source. The first step is often referred to as a deposition diffusion. The second step is often called a redistribution diffusion or a driving-in operation. During the redistribution of impurities an oxide layer is grown thermally in a wet atmosphere over the surface This method results in variations of depth and resistivity that can be difficult to control.

An additional problem is encountered in attempting to fabricate complementary MOS transistors that require within the same body portions of opposite conductivity type that are to provide channel regions. Conventional diffusion techniques as described in the preceding paragraph for transistor base regions fail to provide sufficient control of surface concentration for practical purposes. A surface concentration that is too high for good channel characteristics often results. If the surface concentration is made sufficiently low there is then likely the creation of an N-type inversion layer on the surface of the P-type region.

Another approach to fabricating complementary MOS transistors is to provide one channel region in a substrate of one conductivity type and provide the other in a selectively grown epitaxial region wherein a relatively uniform impurity concentration is possible. Although there has been some success by use of this technique, there are fabrication difficulties that make it desirable to find alternatives using diffusion techniques.

In other instances of semiconductor device and integrated circuit fabrication it is also desirable to be able to achieve greater control of the surface concentration and depth of a diffused P-type region and to permit diffusing to differing depths in the same structure with greater facility.

SUMMARY OF THE INVENTION

It is, therefore, an object of the present invention to provide an improved semiconductor structure having diffused P-type regions.

Another object is to provide an improved method for controllably introducing an acceptor impurity into a semiconductor providing greater control of diffusion results and greater flexibility of design.

Another object is to provide a method of minimizing depletion of the surface of a P-type diffused region.

Another object is to provide an improved complementary MOS transistor structure and method of making the same.

Another object is to provide an improved bipolar transistor structure and method of making the same.

Another object is to provide an improved method for fabricating high value resistors in integrated circuits without adversely affecting transistor base region characteristics.

It has been discovered unexpectedly for acceptor impurities that the wet oxygen redistribution process referred to above results in out-diffusion from the surface and a lessening of surface concentration and diffusion depth and that a region in which impurities are redistributed after protection by an insulating layer such as an oxide layer formed by a deposition technique, such as thermal decomposition of tetraethyl orthosilicate, does not show out-diffusion, retains a higher surface concentration and penetrates to a greater depth within the semiconducor material. The present invention provides methods of utilizing these effects to provide structures not readily fabricated by other methods.

BRIEF DESCRIPTION OF THE DRAWING

The invention, together with the above-mentioned and additional objects and advantages thereof will be better understood by referring to the following description taken with the accompanying drawing therein.

DESCRIPTION OF PREFERRED EMBODIMENTS

The description hereinafter will refer specifically to the diffusion of boron into silicon as such combination is of greatest current interest. It is to be understood, however, in the broader aspects of this invention, that other acceptor impurities, such as gallium and indium, and other semiconductor materials, such as germanium, may be used.

The present invention may be utilized to form a variety of structures. However, in its more general aspects the method of this invention comprises at least the deposition on a surface of N-type single-crystal silicon of boron, or material that releases elemental boron at the diffusion temperature, protecting at least part of the deposited boron with a layer of a deposited insulating material, such as pyrolytically formed silicon dioxide, and heating to redistribute the impurities of the deposited material to achieve the desired extent of diffusion.

Considerable study has been undertaken to understand diffusion effects in semiconductive material and surface phenomena on semiconductive bodies. Such effects are complex and presently not well understood and a precise explanation will not be attempted herein although it will be shown that these effects can be advantageously used in deice fabrication.

The present invention utilizes the different effects on boron diffusion of insulating layers formed by reaction with the substrate surface and insulating layers deposited on substrate without any appreciable reaction with it.

An insulating layer formed by reaction with the substrate surface may be, for example, a silicon dioxide layer formed by oxidation of a silicon surface as by heating a silicon body to a temperature of about 1,100° C. in an oxidizing atmosphere that may contain water vapor or oxygen. Other techniques such as anodic oxidation and high-pressure steam are also suitable.

For a deposited insulating layer, pyrolytic decomposition of a silicon containing material such as tetraethyl-orthosilicate may be used. Decomposition by evaporation from a source of silicon dioxide is also suitable. Other insulating materials which do not react with silicon during formation are also usable.

Layers of silicon dioxide are known to act as a mask to the diffusion of boron in silicon hence permitting selective formation of diffused regions. Both layers formed by reaction with the substrate and deposited layers provide the masking effect. Use of other semiconductors or other acceptor impurities will require selection of appropriate insulating layers for the particular impurity and substrate used and may depend on whether selective diffusion is desired.

Figure 1:
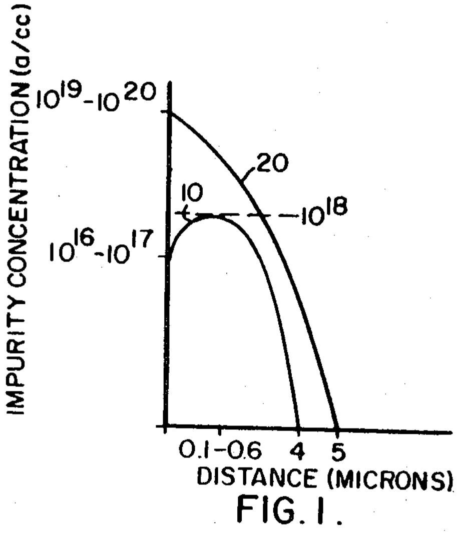
FIG. 1 is a graph illustrating the nature of diffusion results obtained in the practice of this invention.

FIG. 1 illustrates the nature of the differing effects of surface reacted and deposited $SiO_2$ layers on the diffusion of boron into silicon. In the curves of FIG. 1 the values are typical for redistribution at about 1,180° C. for about one hour in about 1 to 2 ohm-cm. N-type silicon. In the curve 10 is illustrated the diffusion profile resulting from the conventional deposition and redistribution process described above wherein wet oxidation or other surface reaction occurs during the redistribution cycle. Wet oxidation after redistribution would cause similar results. Curve 20 illustrates the nature of the diffusion profile in instances in which the deposited boron material has been covered by a deposited layer of silicon dioxide but where otherwise the deposition and redistribution conditions are the same.

It is shown that the material covered by a deposited layer of silicon dioxide retains a higher surface concentration and penetrates further in the semiconductive body. Curve 20 shows an essentially Gaussian distribution profile while curve 10 indicates the surface depletion that occurs during the usual diffusion with oxidation of the surface. The difference in results is generally more pronounced the longer the diffusion time is. Some depletion of boron may occur under the deposited oxide layer but appreciably less than that under the surface reacted oxide.

Figure 2:
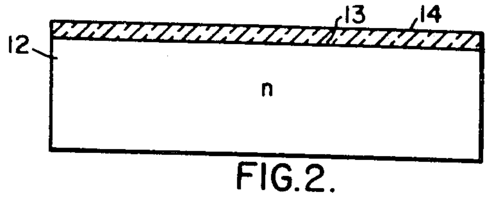
FIGS. 2 through 6 are cross-sectional views at various stages of fabrication of a complementary MOS transistor structure formed in accordance with the present invention.

Referring to FIGS. 2 through 6, there is shown a sequence of operations to produce a complementary MOS transistor structure. FIG. 2 shows an N-type silicon substrate 12 that may, for example, have a resistivity of about 10 ohm-centimeters. On a planar surface 13 of substrate 12 i a layer 14 of a material from which a mask can be formed for the selective diffusion of boron. This may suitably be either thermally grown or pyrolytically deposited silicon dioxide by conventional methods in a layer having a thickness of from about 6,000 Angstroms to about 8,000 Angstroms.

Figure 3:
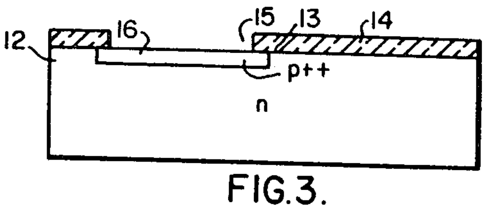

FIG. 3 illustrates the structure after a window 15 has been opened in the oxide layer 14, such as by using conventional photolithographic and etching techniques, and a quantity of boron dopant has been deposited on the surface providing a highly doped, thin surface layer 16.

Figure 4:
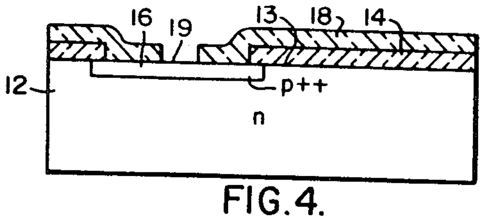

In FIG. 4, a second layer 18 of insulating material, this time of a silicon dioxide deposited on the surface and not resulting from oxidation of the surface itself, is formed over the first layer and within the window opening 15. The portion of the second layer 18 over the first layer 14 itself is not a necessity but does not interfere with the process. A second window 19 is opened in the second layer 18 within the portion covering the boron deposition 16.

The size of the boron deposition is determined by the total desired size of the P-type region in which an N-channel MOS transistor is to be fabricated. The second window is determined by the approximate desired size of the channel portion of that transistor structure.

In FIG. 4 the second layer 18 may be, for example, suitably formed by the reaction of oxygen and tetraethyl-orthosilicate at a temperature of from about 600° C. to about 800° C. to provide a layer having a thickness of at least about 3,000 Angstroms. The second window 19 may also be formed using conventional photolithographic and etching techniques.

Figure 5:
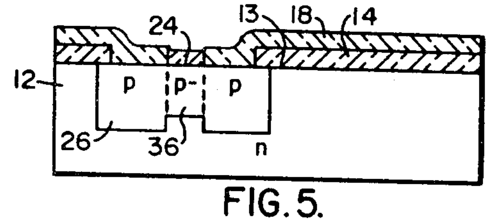

FIG. 5 illustrates the structure after an impurity redistribution has been performed by heating the structure in an atmosphere that oxidizes the surface exposed within the second opening to form layer 24. This may be done, for example, with a temperature of about 1,100°C. to about 1,150° C. for a time of from about 50 minutes to about 3 hours in wet oxygen. The resulting diffused region has two portions. The first portion 26 extends to a greater depth and has a higher surface concentration than that of the second portion 36 that it surrounds. The first portion 26 has a profile characterized by curve 20 of FIG. 1 while the second portion 36 has a profile characterized by curve 10 of FIG. 1.

Figure 6:
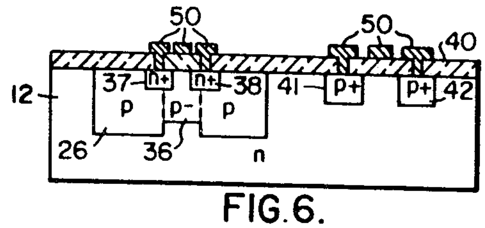

FIG. 6 shows the completed structure after a pair of N-type regions 37 and 38 have been diffused within the P-type region 36 to form source and drain contact regions. The impurity concentration of the second portion 36 of the P-type region is sufficiently low (i.e., less than about $2 \times 10^{17}$ atoms per cubic centimeter) so that an N-type inversion layer will occur under the oxide and provide an N-channel MOS transistor. The first portion 26 has a surface concentration of at least about $2 \times 10^{17}$ at./cc. to avoid an inversion layer. Additionally, elsewhere on the N-type substrate are formed a pair of P+ regions to provide a P-type structure. Passivating layer 40 may retain portions of original layers 14, 18 and 24. Contacts 50 are applied to each of the source and drain regions and on the passivating layer 40 over each channel region.

As a result of the practice of this invention there is provided within a unitary body both n and p channel MOS transistors with good characteristics. It is desirable to have a relatively high resistivity channel region 36 while avoiding the inversion layer surrounding the channel region that is in the portion 26. Substantial advantages are provided over conventional diffusion techniques and also over selective epitaxial growth techniques.

Figure 7:
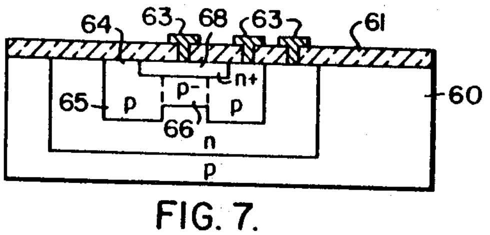
FIG. 7 is a partial cross-sectional view of a semiconductor device structure illustrating a bipolar transistor structure formed in accordance with the present invention.

FIG. 7 further illustrates the practice of this invention in a bipolar transistor. Shown is part of an integrated circuit structure that includes P-type substrate 60 having an N-type region 62 therein that may be of epitaxially grown material. P-type region 64 that serves as the transistor base region is formed in accordance with this invention to have a first portion 65 having a higher impurity concentration and greater depth than the second portion 66 that it surrounds. The region 64 may be formed in the manner described for the region of FIGS. 5 and 6 having portions 26 and 36. Emitter region 68 is diffused over the P-portion 66 of the base region.

In FIG. 7 the structure except for the base region 64 may be made by conventional techniques. A passivating layer 61 and contacts 63 are provided.

A bipolar transistor like that of FIG. 7, as well as the MOS structure in the left-hand portion of FIG. 6, avoids the necessity of using a separately diffused annular ring to avoid surface leakage such as between the emitter and collector regions 68 and 62. The portion 65 of the base may have sufficiently high-surface concentration (i.e. at least about $10^{17}$ atoms per cubic centimeter) to prevent the existence of an N-type inversion layer. Since essentially all transistor action will occur where the emitter and collector regions are closest spaced, i.e., across base portion 66, the transistor is less affected by deterioration of characteristics by surface effects created by aging of the device or by particular bias conditions.

A bipolar transistor having a base region as shown in FIG. 7 may be formed separately as well as in integrated circuits.

Figure 8:
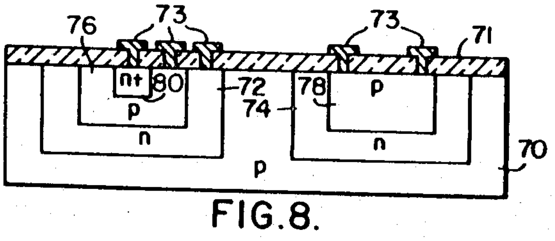
FIG. 8 is a partial cross-sectional view of a semiconductor integrated circuit illustrating a bipolar transistor and a resistance region formed in accordance with the present invention.

FIG. 8 illustrates another structure that may be made in accordance with this invention. Here, an integrated circuit having P-type substrate 70 has formed in one N-type pocket 72 a bipolar transistor wherein region 72 provides the collector, P-type region 76 is the base and N-type region 80 is the emitter. The base 76 may be formed as in FIG. 7 or conventionally, i.e., where all of it would be similar to P-portion 66. In the right-hand N-type pocket 77 is a resistance region 78. What is to be emphasized here is that the regions 76 and 78 may, if desired, have different characteristics although made in the same deposition and redistribution operations. For example, greater control over the resistivity of resistance region 78 can be achieved if it is formed by redistribution while being protected by a deposited passivating layer. Additional design flexibility is achieved by using the same mask layout for two different integrated circuits that differ in one or more resistance values. Passivating layer 71 and contacts 73 are provided in the usual manner.

While the present invention has been shown and described in a few forms only, it will be apparent that various modifications may be made without departing from the spirit regions 68 and 62. The portion 65 of the base may have sufficiently high-surface concentration (i.e. at least about $10^{17}$ atoms per cubic centimeter) to prevent the existence of an N-type inversion layer. Since essentially all transistor action will occur where the emitter and collector regions are closest spaced, i.e., across base portion 66, the transistor is less affected by deterioration of characteristics by surface effects created by aging of the device or by particular bias conditions.

A bipolar transistor having a base region as shown in FIG. 7 may be formed separately as well as in integrated circuits.

FIG. 8 illustrates another structure that may be made in accordance with this invention. Here, an integrated circuit having P-type substrate 70 has formed in one N-type pocket 72 a bipolar transistor wherein region 72 provides the collector, P-type region 76 is the base and N-type region 80 is the emitter. The base 76 may be formed as in FIG. 7 or conventionally, i.e., where all of it would be similar to P-portion 66. In the right-hand N-type pocket 77 is a resistance region 78. What is to be emphasized here is that the regions 76 and 78 may, if desired, have different characteristics although made in the same deposition and redistribution operations. For example, greater control over the resistivity of resistance region 78 can be achieved if it is formed by redistribution while being protected by a deposited passivating layer. Additional design flexibility is achieved by using the same mask layout for two different integrated circuits that differ in one or more resistance values. Passivating layer 71 and contacts 73 are provided in the usual manner.

While the present invention has been shown and described in a few forms only, it will be apparent that various modifications may be made without departing from the spirit and scope thereof.

I claim:

1. A process for controllably introducing an acceptor impurity into silicon to form at least one PN junction with differing junction depth, said process comprising:

1. forming on the surface of N-type conductivity silicon a first layer of an insulating material that acts as a barrier to boron;
2. forming at least a first window within said first layer;
3. depositing boron on said surface within the area defined by said first window;
4. depositing on the surface of said first layer and on said surface within the area defined by said first window a second layer of an oxide of silicon formed by a vapor reaction;
5. forming a second window within said second layer where said second layer is at least partially within said first window;
6. heating to redistribute the deposited boron in an atmosphere that oxidizes said surface whereby said boron forms a P-type region that penetrates more deeply and has a higher surface concentration under said second layer than under said second window within said second layer, and thereafter selectively diffusing a pair of spaced N-type regions in said P-type region, thereby defining a field effect channel region therebetween of material under said second window.

* * * * *